US008987731B2

(12) United States Patent
Yamazaki

(10) Patent No.: US 8,987,731 B2
(45) Date of Patent: Mar. 24, 2015

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/895,577

(22) Filed: May 16, 2013

(65) Prior Publication Data
US 2013/0320330 A1    Dec. 5, 2013

(30) Foreign Application Priority Data

May 31, 2012    (JP) ................. 2012-125394

(51) Int. Cl.
H01L 29/12    (2006.01)
H01L 29/786    (2006.01)

(52) U.S. Cl.
CPC ...... *H01L 29/78693* (2013.01); *H01L 29/7869* (2013.01)
USPC ............................... 257/43; 257/66; 257/288

(58) Field of Classification Search
CPC . H01L 29/7869; H01L 29/78; H01L 27/1225; H01L 29/66969; H01L 29/66477
USPC .................. 257/57, 52, 66, 43, 288, E21.411, 257/E29.273, E31.091, E33.053; 438/680, 438/787, 261, 308, 151, 142, 149, 104
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    101621075    1/2010
CN    101794820    8/2010
(Continued)

OTHER PUBLICATIONS

Ono.M et al., "Novel High Performance IGZO-TFT with High Mobility over 40 cm2/Vs and High Photostability Incorporated Oxygen Diffusion,", IDW'11 : Proceedings of the 18th International Display Workshops, Dec. 7, 2011, pp. 1689-1690.
(Continued)

*Primary Examiner* — Thien F Tran
(74) *Attorney, Agent, or Firm* — Eric J. Robinson; Robinson Intellectual Property Law Office, P.C.

(57) ABSTRACT

In order to form a structure in which an oxide semiconductor layer through which a carrier flows is not in contact with a gate insulating film, a buried channel structure in which the oxide semiconductor layer through which a carrier flows is away from the gate insulating film containing silicon is provided. Specifically, a buffer layer is provided between the gate insulating film and the oxide semiconductor layer. Both the oxide semiconductor layer and the buffer layer are formed using materials containing indium and another metal element. The composition of indium with respect to gallium contained in the oxide semiconductor layer is higher than the composition of indium with respect to gallium contained in the buffer layer. The buffer layer has a smaller thickness than the oxide semiconductor layer.

17 Claims, 10 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0181565 A1 | 7/2010 | Sakata et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0090204 A1 | 4/2011 | Yamazaki et al. |
| 2011/0140100 A1* | 6/2011 | Takata et al. .................. 257/43 |
| 2011/0156026 A1* | 6/2011 | Yamazaki et al. ............. 257/43 |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2012/0119205 A1 | 5/2012 | Taniguchi et al. |
| 2012/0153278 A1 | 6/2012 | Jeong et al. |
| 2012/0305913 A1 | 12/2012 | Yamazaki et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009220 A1 | 1/2013 | Yamazaki et al. |
| 2013/0320334 A1 | 12/2013 | Yamazaki et al. |

FOREIGN PATENT DOCUMENTS

| | | |
|---|---|---|
| CN | 101901838 | 12/2010 |
| CN | 102576518 | 7/2012 |
| EP | 1737044 A | 12/2006 |
| EP | 2141743 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-270617 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2009-231613 | 10/2009 |

(56) References Cited

FOREIGN PATENT DOCUMENTS

| | | |
|---|---|---|
| JP | 2010-016347 | 1/2010 |
| JP | 2010-016348 A | 1/2010 |
| JP | 4415062 | 2/2010 |
| JP | 2010-067954 | 3/2010 |
| JP | 2010-177431 | 8/2010 |
| JP | 2010-186994 A | 8/2010 |
| JP | 4571221 | 10/2010 |
| JP | 2011-009724 A | 1/2011 |
| JP | 2011-141523 A | 7/2011 |
| JP | 2011-155249 | 8/2011 |
| JP | 2011-243745 A | 12/2011 |
| JP | 2012-160679 | 8/2012 |
| KR | 2010-0002504 A | 1/2010 |
| KR | 2010-0084466 A | 7/2010 |
| KR | 2010-0129185 A | 12/2010 |
| KR | 2012-0099228 A | 9/2012 |
| TW | 201114040 | 4/2011 |
| TW | 201207827 | 2/2012 |
| WO | WO-2004/114391 | 12/2004 |
| WO | WO-2008/133345 | 11/2008 |
| WO | WO-2011/046032 | 4/2011 |

OTHER PUBLICATIONS

International Search Report (Application No. PCT/JP2013/063873) Dated Aug. 6, 2013.

Written Opinion (Application No. PCT/JP2013/063873) Dated Aug. 6, 2013.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest'04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW'08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest'09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its

(56) References Cited

OTHER PUBLICATIONS

Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review, A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

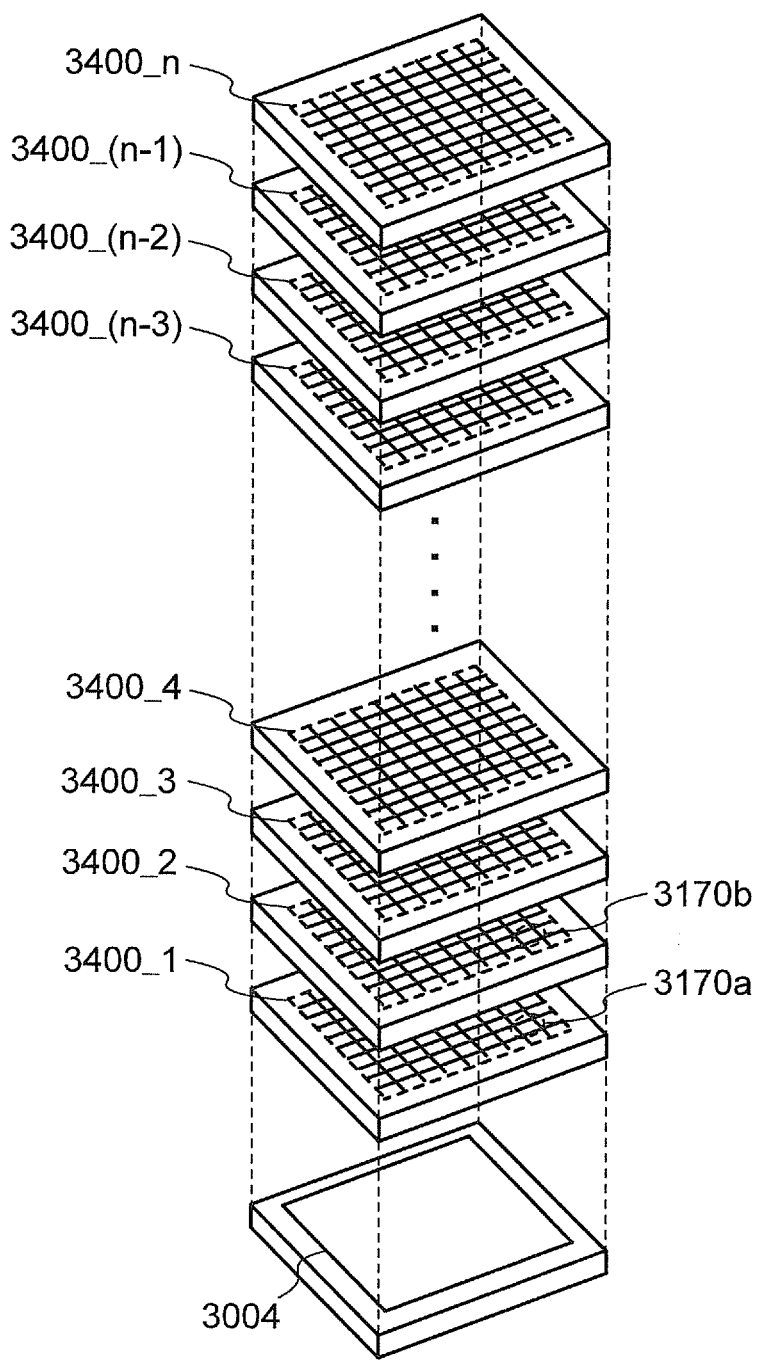

SEMICONDUCTOR DEVICE AND METHOD FOR MANUFACTURING THE SAME

TECHNICAL FIELD

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor by using an oxide semiconductor film for a channel formation region, or the like has been attracting attention. Examples of such a transistor include a transistor in which zinc oxide (ZnO) is used as an oxide semiconductor film and a transistor in which $InGaO_3(ZnO)_m$ is used as an oxide semiconductor film.

Patent Document 1 discloses a three-layer structure in which a first multi-component oxide semiconductor layer over a substrate, a single-component oxide semiconductor layer over the first multi-component oxide semiconductor layer, and a second multi-component oxide semiconductor layer over the single-component oxide semiconductor layer are stacked.

REFERENCE

Patent Document

[Patent Document 1] Japanese Published Patent Application No. 2011-155249

DISCLOSURE OF INVENTION

Electric characteristics of a transistor including an oxide semiconductor layer are affected by an insulating film in contact with the oxide semiconductor, that is, by an interface state between the oxide semiconductor layer and the insulating film.

For example, in the case where an insulating film containing silicon (e.g., silicon oxide film) is used as the insulating film and an oxide semiconductor layer is formed by a sputtering method over the silicon oxide film, silicon might possibly enter the oxide semiconductor layer in sputtering. The entry of silicon into the oxide semiconductor layer may possibly cause a reduction in the field-effect mobility of a transistor.

Further, when a silicon nitride film is used as the insulating film, a large amount of carriers flow in an interface between the silicon nitride film and the oxide semiconductor layer, which makes it difficult to obtain transistor characteristics.

One object is to provide a transistor structure with high filed-effect mobility.

Thus, a structure in which an oxide semiconductor layer through which a carrier flows is not in contact with a gate insulating film containing silicon is formed. In order to achieve such a structure, a stacked-layer structure in which a channel layer is sandwiched between the other layers (here, the structure is called "buried channel structure") is provided. In the buried channel structure, an oxide semiconductor layer through which a carrier flows is away from a gate insulating film containing silicon. Specifically, a buffer layer is provided between the gate insulating film and the oxide semiconductor layer. Both the oxide semiconductor layer and the buffer layer are formed using materials containing indium and another metal element (referred to as a metal element M). Examples of the metal element M include gallium and hafnium. The composition of indium with respect to the metal element M (e.g., gallium) in the oxide semiconductor layer is higher than the composition of indium with respect to gallium in the buffer layer. Further, the buffer layer with a thickness smaller than that of the oxide semiconductor layer is formed using a material in which the composition of indium with respect to the metal element in the oxide semiconductor layer is low.

Further, it is preferable that the oxide semiconductor layer be sandwiched between a first buffer layer and a second buffer layer so as to prevent the oxide semiconductor layer through which a carrier flows from being in contact with the insulating film containing silicon.

A structure of the present invention disclosed in this specification is a semiconductor device including a first insulating layer over an insulating surface, a first buffer layer over the first insulating layer, an oxide semiconductor layer over the first buffer layer, a second buffer layer over the oxide semiconductor layer, and a second insulating layer over the second buffer layer. The oxide semiconductor layer, the first buffer layer, and the second buffer layer are formed using an oxide semiconductor material containing at least indium and gallium. A composition of indium with respect to gallium contained in the oxide semiconductor layer is higher than a composition of indium with respect to gallium contained in the first and second buffer layers. The thickness of the oxide semiconductor layer is larger than those of the first and second buffer layers.

In the case of a bottom-gate transistor, a gate electrode layer is provided between the insulating surface and the first insulating layer in the above structure.

On the other hand, in the case of a top-gate transistor, a gate electrode layer is provided over the second insulating layer in the above structure.

Further, in the case of a dual-gate transistor including gate electrode layers over and below the oxide semiconductor layer, a first gate electrode layer is provided between the insulating surface and the first insulating layer, and a second gate electrode layer is provided over the second insulating layer in the above structure.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fits inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping its crystal state, whereby the crystal state of the sputtering target is transferred to the substrate and the CAAC-OS film can be formed.

For the deposition of the CAAC-OS film, the following conditions are preferably used.

Reduction in the amount of impurities entering the CAAC-OS film during the deposition can prevent the crystal state from being broken by the impurities. For example, impurities (e.g., hydrogen, water, carbon dioxide, or nitrogen) which exist in a deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In a transistor using the CAAC-OS film, change in electric characteristics of the transistor due to irradiation with visible light or ultraviolet light is small. Thus, the transistor has high reliability.

In the case where an oxide semiconductor layer and a buffer layer are CAAC-OS films, the oxide semiconductor layer and the buffer layer have the same crystal structure; thus, there are few defects at the interface, and high field-effect mobility can be achieved. Further, it is preferable that the buffer layer be formed over and in contact with the oxide semiconductor layer that is a CAAC-OS film. This is because the oxide semiconductor layer serves as a seed of crystal, and the buffer layer formed thereover is easily crystallized to have the same crystal structure as the oxide semiconductor layer.

A carrier flow path is generated at about 5 nm away from an interface of the gate insulating layer; thus, the thickness of the buffer layer is greater than or equal to 2 nm and less than or equal to 15 nm, preferably greater than or equal to 5 nm and less than or equal to 10 nm. The oxide semiconductor layer is formed thicker than the buffer layer. In such a structure, a carrier flows at the interface between the buffer layer and the oxide semiconductor layer or in the oxide semiconductor layer. In other words, in such a structure, the oxide semiconductor layer through which a carrier flows is away from the gate insulating film containing silicon.

A transistor structure with high field-effect mobility can be achieved.

BRIEF DESCRIPTION OF DRAWINGS

FIG. 7 is a perspective view illustrating one embodiment of a semiconductor device.

BEST MODE FOR CARRYING OUT THE INVENTION

Figure 1A:
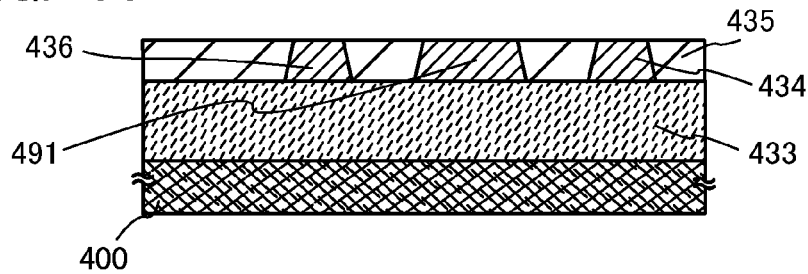
FIGS. 1A to 1D are cross-sectional views illustrating manufacturing steps of one embodiment of the present invention.
Figure 1B:
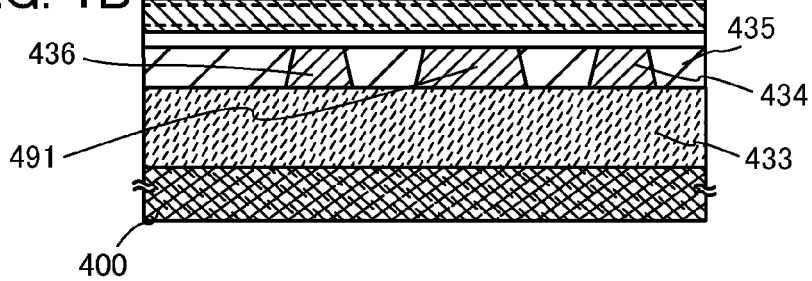

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and a method for manufacturing the semiconductor device will be described with reference to FIGS. 1A to 1D. In this embodiment, an example of a method for manufacturing a transistor including an oxide semiconductor film is described.

First, an insulating film 433 is formed over a substrate 400 having an insulating surface. A conductive film is formed over the insulating film 433 by a sputtering method, an evaporation method, or the like, and the conductive film is etched, so that a conductive layer 491 and wiring layers 434 and 436 are formed.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The insulating film 433 can be formed using one or more insulating films selected from the following: an oxide insulating film of silicon oxide, gallium oxide, hafnium oxide, yttrium oxide, aluminum oxide, or the like; a nitride insulating film of silicon nitride, aluminum nitride, or the like; an oxynitride insulating film of silicon oxynitride, aluminum oxynitride, or the like; or a nitride oxide insulating film of silicon nitride oxide or the like. Note that "silicon nitride oxide" contains more nitrogen than oxygen and "silicon oxynitride" contains more oxygen than nitrogen. In the case where a substrate provided with a semiconductor element is used, a silicon nitride film is preferably used as the insulating film 433, which is formed by a plasma CVD method with use of a mixed gas of silane ($SiH_4$) and nitrogen ($N_2$) as a supply gas. This silicon nitride film also functions as a barrier film, which has a function of preventing entry of hydrogen or a hydrogen compound into an oxide semiconductor layer formed later so as to improve the reliability of a semiconductor device. In the case where the silicon nitride film is formed by a plasma chemical vapor deposition (CVD) method with use of a mixed gas of silane ($SiH_4$), ammonia ($NH_3$), and nitrogen ($N_2$) as a supply gas, the amount of defects in the film can be reduced as compared with the case where the silicon nitride film is formed with use of a mixed gas of silane ($SiH_4$) and nitrogen ($N_2$) as a supply gas. When the thickness of the silicon nitride film formed with use of a mixed gas of silane ($SiH_4$), ammonia ($NH_3$), and nitrogen ($N_2$) as a supply gas is greater than or equal to 300 nm and less than or equal to 400 nm, the ESD resistance can be 300 V or higher. Thus, in the case where the insulating film 433 is a stacked film in which a silicon nitride film is formed with use of a mixed gas of silane ($SiH_4$), ammonia ($NH_3$), and nitrogen ($N_2$) to have a thickness greater than or equal to 300 nm and less than or equal to 400 nm and a silicon nitride film is formed thereover with use of a mixed gas of silane ($SiH_4$) and nitrogen ($N_2$) as a supply gas, a barrier film with high ESD resistance can be obtained.

The conductive layer 491 and the wiring layers 434 and 436 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the conductive layer 491 and the wiring layers 434 and 436. The conductive layer 491 and the wiring layers 434 and 436 may have a single-layer structure or a stacked structure.

The conductive layer 491 and the wiring layers 434 and 436 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 491 and the wiring layers 434 and 436 have a stacked structure of the above conductive material and the above metal material.

In order to obtain a normally-off switching element, it is preferable that the threshold voltage of the transistor is made positive by using a material having a work function of 5 eV (electron volts) or higher, preferably 5.5 eV or higher, for a gate electrode layer. Specifically, a material which includes an In—N bond and has a specific resistivity of $1 \times 10^{-1} \Omega \cdot cm$ to $1 \times 10^{-4} \Omega \cdot cm$, preferably $5 \times 10^{-2} \Omega \cdot cm$ to $1 \times 10^{-4} \Omega \cdot cm$, is used for the gate electrode layer. Examples of the material are an In—Ga—Zn-based oxide film containing nitrogen, an In—Sn—O film containing nitrogen, an In—Ga—O film containing nitrogen, an In—Zn—O film containing nitrogen, an In—O film containing nitrogen, and a metal nitride film (e.g., an InN film).

Next, an oxide insulating film is formed over the conductive layer 491 and the wiring layers 434 and 436. The oxide insulating film has projections caused by the shape of the conductive layer 491 and the wiring layers 434 and 436 on its surface.

The oxide insulating film can be formed by a plasma CVD method, a sputtering method, or the like using any of silicon oxide, silicon oxynitride, aluminum oxide, aluminum oxynitride, hafnium oxide, gallium oxide, gallium zinc oxide, and zinc oxide, or a mixed material thereof. The oxide insulating film may have either a single-layer structure or a stacked structure.

Then, polishing treatment (e.g., chemical mechanical polishing: CMP) is performed, so that an oxide insulating film 435 which is a planarized film is formed and top surfaces of the wiring layers 434 and 436 and a top surface of the conductive layer 491 are exposed. After the CMP treatment, cleaning is performed, and heat treatment for removing moisture attached to the substrate is performed. A cross-sectional view illustrating a state where steps up to and including the heat treatment have been done corresponds to FIG. 1A.

After the planarization, an insulating film 437 and a stacked layer 403 including oxide semiconductor films are formed. A cross-sectional view illustrating a state where the steps up to and including the formation have been done corresponds to FIG. 1B.

Then, patterning is performed. Here, with use of one mask, the insulating film 437 and the stacked layer 403 including oxide semiconductor films are selectively etched. A cross-sectional view illustrating a state where steps up to and including the etching have been done corresponds to FIG. 1C. It is preferable that the insulating film 437 and the stacked layer 403 including oxide semiconductor films be successively formed without being exposed to the air because impurity contamination at the film interface can be prevented.

The insulating film 437 is formed by a plasma CVD method or a sputtering method. Among plasma CVD methods, the following plasma CVD method that is also referred to as a microwave plasma CVD method is preferably used: plasma is generated by utilizing field effect energy of a microwave particularly, a source gas of the insulating film is excited by the plasma, the excited source gas is reacted over a formation subject, and the reactant is deposited. Further, the insulating film formed by a plasma CVD method using a microwave is a dense film; thus, the insulating film 437 formed by processing the insulating film is also a dense film. The thickness of the insulating film 437 is greater than or equal to 5 nm and less than or equal to 300 nm The insulating film 437 can be formed using one or more insulating films selected from the following: an oxide insulating film of silicon oxide, gallium oxide, hafnium oxide, yttrium oxide, aluminum oxide, or the like; an oxynitride insulating film of silicon oxynitride, aluminum oxynitride, or the like; or a nitride oxide insulating film of silicon nitride oxide or the like. As another material of the insulating film 437, a target with an atomic ratio where In:Ga:Zn=1:3:2 may be used to form an In—Ga—Zn-based oxide film.

Figure 1C:
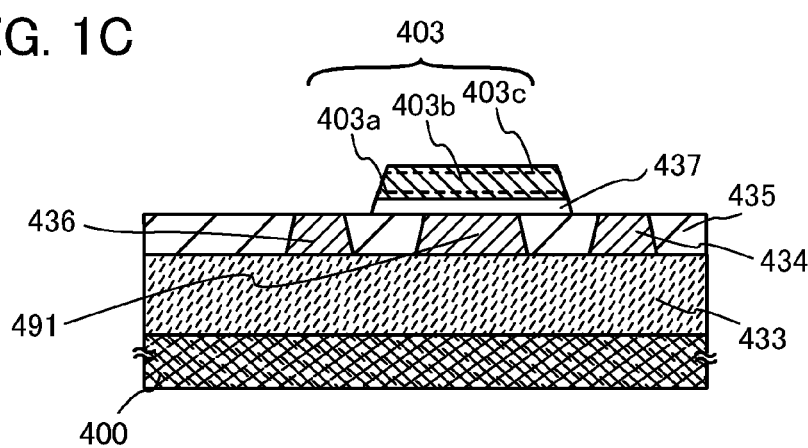
Figure 1D:
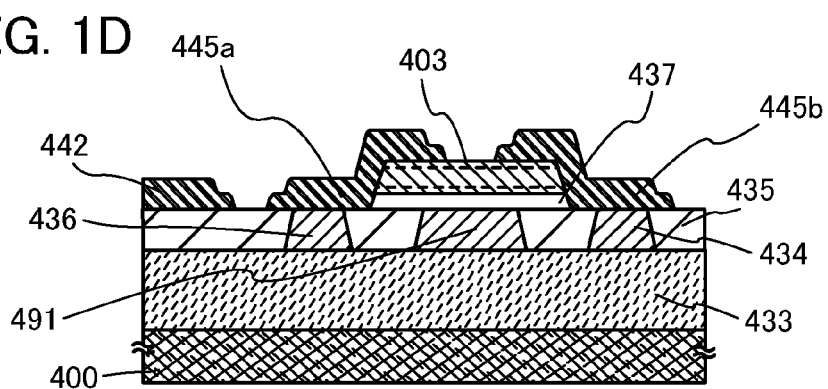

In this embodiment, the stacked layer 403 including oxide semiconductor films has a three-layer structure where a first oxide semiconductor film 403a, a second oxide semiconductor film 403b, and a third oxide semiconductor film 403c are stacked in this order as illustrated in FIG. 1C.

The oxide semiconductor film can be formed using an oxide including at least In and another metal element M (M is Ga, Hf, Zn, Mg, Sn, or the like). Examples of such an oxide include the following oxides: a two-component metal oxide such as an In—Zn-based oxide, an In—Mg-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In-Sn—Ga—Zn-based oxide, an In—Hf—Ga—Zn-based oxide, or an In—Sn—Hf—Zn-based oxide.

As the first oxide semiconductor film 403a, a 10-nm-thick In—Ga—Zn-based oxide film formed with a target having an atomic ratio where In:Ga:Zn=1:1:1 is used. Note that the first oxide semiconductor film 403a can be referred to as a first buffer layer.

As the second oxide semiconductor film 403b, a 20-nm-thick In—Ga—Zn-based oxide film formed with a target having an atomic ratio where In:Ga:Zn=3:1:2 is used. The composition of indium with respect to gallium contained in the second oxide semiconductor film 403b is higher than the composition of indium with respect to gallium contained in the first buffer layer. In the second oxide semiconductor film 403b, the amount of indium is preferably larger than that of gallium.

As the third oxide semiconductor film 403c, a 10-nm-thick In—Ga—Zn-based oxide film formed with a target having an atomic ratio where In:Ga:Zn=1:1:1 is used. Note that the third oxide semiconductor film 403c can be referred to as a second buffer layer.

The first buffer layer and the second buffer layer each have a smaller thickness than the second oxide semiconductor film 403b through which a carrier flows. Further, as compared with a material of the second oxide semiconductor film 403b through which a carrier flows, a material having a low composition of indium with respect to a metal element contained in the oxide semiconductor layer is used for the first buffer layer and the second buffer layer. It is preferable that each of the first buffer layer and the second buffer layer have such a composition that the amount of indium is the same as or less than or equal to that of gallium.

In such a stacked structure, the second oxide semiconductor film 403b through which a carrier flows is not in contact with the insulating film containing silicon.

Further, targets used for forming the first oxide semiconductor film 403a and the third oxide semiconductor film 403c and a target used for forming the second oxide semiconductor film 403b are preferably polycrystalline targets, and CAAC-OS films are preferably formed as the first to third oxide semiconductor films. Alternatively, when the second oxide semiconductor film 403b has a composition which enables the film to be easily crystallized, the first oxide semiconductor film 403a and the third oxide semiconductor film 403c, which are in contact with the second oxide semiconductor film 403b, can be crystallized. Since there are few defects at the interface between the first oxide semiconductor film 403a and the second oxide semiconductor film 403b and few defects at the interface between the second oxide semiconductor film 403b and the third oxide semiconductor film 403c, high field-effect mobility can be achieved. The thicknesses and compositions of the oxide semiconductor films are preferably adjusted so that a carrier flows through only the second oxide semiconductor film 403b.

The insulating film 437 and the first oxide semiconductor film 403a are successively formed without being exposed to the air, which can prevent the interface between the insulating film 437 and the first oxide semiconductor film 403a from being contaminated by impurities. The second oxide semiconductor film 403b and the third oxide semiconductor film 403c are successively formed without being exposed to the air, which can prevent the interface between the second oxide semiconductor film 403b and the third oxide semiconductor film 403c from being contaminated by impurities. In addition, the third oxide semiconductor film 403c also functions as a protective film which prevents the second oxide semiconductor film 403b from being in contact with the air in a later step such as an etching step. Thus, impurities such as silicon are prevented from entering the inside of the second oxide semiconductor film 403b through which a carrier flows and the interfaces of the film (on both the upper surface side and the bottom surface side of the film), which achieves high field-effect mobility.

After the insulating film 437 and the stacked layer 403 including oxide semiconductor films are formed, a conductive film is formed. This conductive film is selectively etched, so that electrode layers 445a and 445b and a conductive layer 442 are formed. A cross-sectional view illustrating a state where steps up to and including the formation have been done corresponds to FIG. 1D. By performing etching plural times at this time, electrodes each having projections at lower end portions when seen in cross section are formed. The electrode layers 445a and 445b each having projections at lower end portions function as source and drain electrode layers of a transistor. The electrode layer 445a is provided over and in contact with the wiring layer 436. The electrode layer 445b is provided over and in contact with the wiring layer 434.

A distance between the electrode layers 445a and 445b corresponds to a channel length L of the transistor. In the case where the channel length L of the transistor is less than 50 nm, for example, about 30 nm, a developed mask which is obtained by exposing a resist with use of an electron beam is preferably used as a mask for etching the conductive film. At a higher acceleration voltage, an electron beam can provide a more precise pattern. The use of multiple electron beams as an electron beam can shorten the process time per substrate. Here, in an electron beam writing apparatus capable of electron beam irradiation, the acceleration voltage is preferably in the range from 5 kV to 50 kV, for example. The current intensity is preferably in the range from $5\times10^{-12}$ A to $1\times10^{-11}$ A. The minimum beam size is preferably 2 nm or less. The minimum possible pattern line width is preferably 8 nm or less. Under the above conditions, a pattern with a width of, for example, 30 nm or less, preferably 20 nm or less, more preferably 8 nm or less, can be obtained.

Then, an insulating film 402 is formed over the electrode layers 445a and 445b, the conductive layer 442, and the stacked layer 403 including oxide semiconductor films. A material of the insulating film 402 can be a silicon oxide film, a gallium oxide film, a gallium zinc oxide film, a $Ga_2O_3$ ($Gd_2O_3$) film, a zinc oxide film, an aluminum oxide film, a silicon nitride film, a silicon oxynitride film, an aluminum oxynitride film, or a silicon nitride oxide film. As another material of the insulating film 402, an In—Ga—Zn-based oxide film having low conductivity can be given. The In—Ga—Zn-based oxide film having low conductivity may be formed under the following conditions: an oxide target containing In, Ga, and Zn in an atomic ratio of 1:3:2 is used, the substrate temperature is room temperature, and a sputtering gas is an argon gas or a mixed gas of argon and oxygen.

The insulating film 402 preferably includes a region containing oxygen in excess of the stoichiometric composition (the region is referred to as an oxygen excess region). When an insulating layer in contact with the stacked layer 403 including oxide semiconductor films includes an oxygen excess region, oxygen can be supplied to the stacked layer 403 including oxide semiconductor films. Thus, elimination of oxygen from the stacked layer 403 can be prevented, and oxygen can be supplied to oxygen vacancies in the stacked layer 403. In order to provide the oxygen excess region in the insulating film 402, the insulating film 402 may be formed in an oxygen atmosphere, for example. Alternatively, oxygen may be introduced into the formed insulating film 402 to provide the oxygen excess region therein. Further, the insulating film 402 preferably has a stacked structure. Over an insulating film including an oxygen excess region, a silicon oxide film or a silicon oxynitride film is formed under conditions where a high-frequency power that is higher than or equal to 0.17 W/cm$^2$ and lower than or equal to 0.5 W/cm$^2$, preferably, higher than or equal to 0.26 W/cm$^2$ and lower than or equal to 0.35 W/cm$^2$ is supplied. Specifically, the conditions for forming the silicon oxynitride film are as follows: silane (SiH$_4$) and dinitrogen monoxide (N$_2$O) which are source gases are supplied at 160 sccm and 4000 sccm, respectively, into a treatment chamber; the pressure of the treatment chamber is adjusted to 200 Pa; and a power of 1500 W is supplied with a high-frequency power supply of 27.12 MHz. Further, the substrate temperature at which the silicon oxynitride film is formed is 220° C.

Next, the insulating film 402 is selectively etched to have an opening reaching the conductive layer 442. Then, a conductive film is formed and selectively etched, so that an electrode layer 438 electrically connected to the conductive layer 442 and a gate electrode layer 401 overlapping with the stacked layer 403 including oxide semiconductor films with the insulating film 402 interposed therebetween are formed. An insulating film 407 functioning as a barrier film is provided so as to cover the gate electrode layer 401 and the electrode layer 438.

As the insulating film 407, a silicon nitride film is preferably formed by a plasma CVD method with use of a mixed gas of silane (SiH$_4$) and nitrogen (N$_2$) as a supply gas. This silicon nitride film functions as a barrier film, which has a function of preventing entry of hydrogen or a hydrogen compound into the oxide semiconductor films so as to improve the reliability of a semiconductor device.

The gate electrode layer 401 and the electrode layer 438 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401 and the electrode layer 438. The gate electrode layer 401 and the electrode layer 438 may have a single-layer structure or a stacked structure.

In this embodiment, a tungsten film is used as the gate electrode layer 401 over and in contact with the insulating film 402.

Figure 2A:
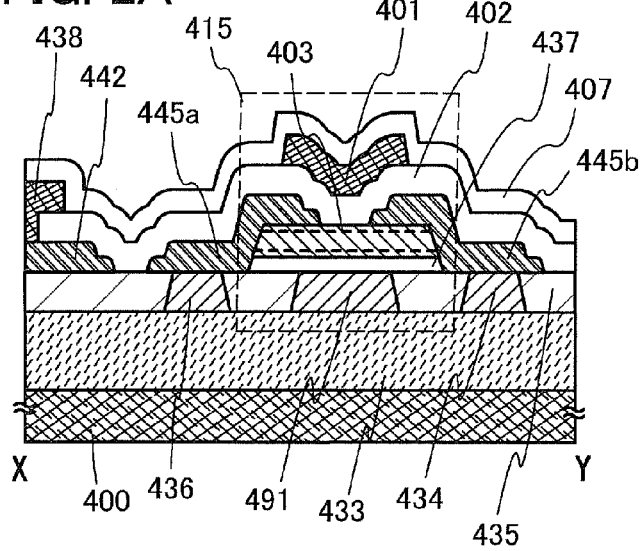
FIGS. 2A to 2C are respectively a cross-sectional view, a top view, and an energy band diagram illustrating one embodiment of the present invention.

Through the above steps, a transistor 415 of this embodiment can be manufactured (see FIG. 2A). The transistor 415 is an example of a dual-gate transistor. FIG. 2A is a cross-sectional view taken along the channel length direction of the transistor 415. Note that in the dual-gate transistor 415, the insulating film 437 functions as a first gate insulating film, and the insulating film 402 functions as a second gate insulating film.

The conductive layer 491 can serve as a back gate which controls the electrical characteristics of the transistor 415. For example, by setting the potential of the conductive layer 491 to GND (or a fixed potential), the threshold voltage of the transistor 415 is shifted in a positive direction, so that the transistor can be normally-off.

Further, when the conductive layer 491 is not provided, a top-gate transistor can be obtained. Without a change in the number of steps, both a dual-gate transistor and a top-gate transistor can be formed over one substrate by changing a layout.

Figure 2C:
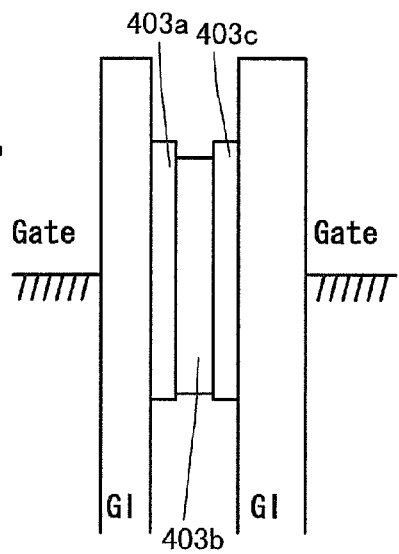
Figure 2B:
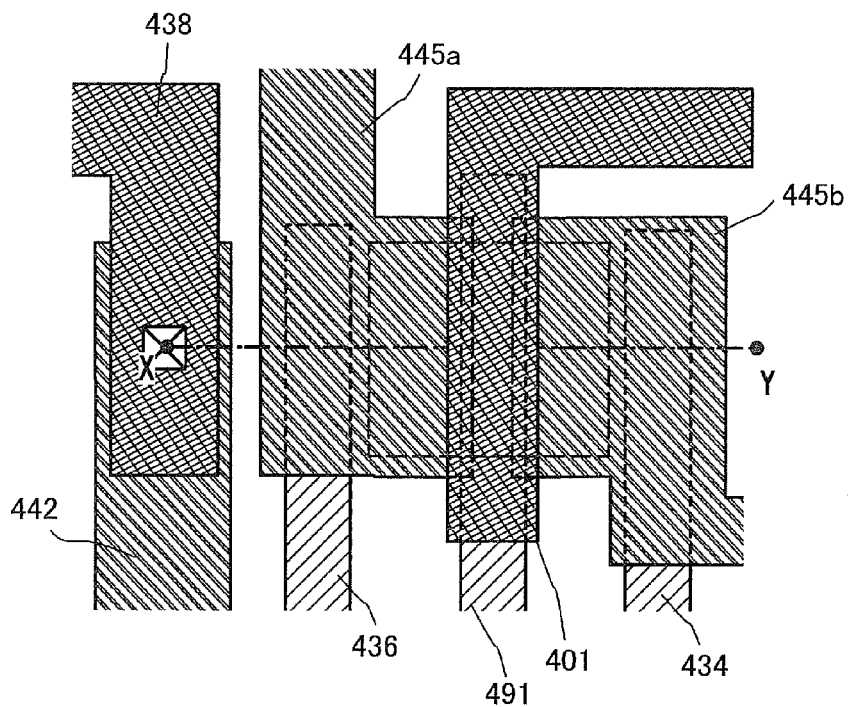

FIG. 2B shows an example of a top view of the transistor 415 whose cross section taken along dotted line X-Y in FIG. 2B corresponds to FIG. 2A.

Further, FIG. 2C is an energy band diagram in the thickness direction in FIG. 2A. In this embodiment, materials of the first oxide semiconductor film 403$a$, the second oxide semiconductor film 403$b$, and the third oxide semiconductor film 403$c$ are selected so that an energy band shown in FIG. 2C is obtained. Note that when a channel buried in the stacked-layer structure is formed in the conduction band, sufficient effects can be obtained. Thus, an energy band diagram is not necessarily limited to a structure in which both the conduction band and the valence band have a depressed portion as in FIG. 2C; for example, a structure in which only the conduction band has a depressed portion may be employed.

Embodiment 2

In this embodiment, an example of a method for manufacturing a bottom-gate transistor will be described below. Part of steps in a manufacturing process is the same as that in Embodiment 1, and thus the detailed description of the part of the steps is omitted.

First, steps up to and including the step in FIG. 1C, which are described in Embodiment 1, are performed. Specifically, over the substrate 400, the conductive layer 491 and the wiring layers 434 and 436 are formed. Over the conductive layer 491 and the wiring layers 434 and 436, an oxide insulating film is formed. Then, polishing treatment (CMP) is performed, so that the planarized oxide insulating film 435 is formed and top surfaces of the wiring layers 434 and 436 and a top surface of the conductive layer 491 are exposed. After the CMP treatment, cleaning is performed, and then heat treatment for removing moisture attached on the substrate is performed. After the planarization, the insulating film 437 and the stacked layer 403 including oxide semiconductor films are formed. Then, patterning is performed. Here, with use of one mask, the insulating film 437 and the stacked layer 403 including oxide semiconductor films are selectively etched. Through the steps up to here, the same stage as that in FIG. 1C is obtained.

In this embodiment, with use of the resist mask which has been used in the step of selectively etching the insulating film 437 and the stacked layer 403 including oxide semiconductor films, the oxide insulating film 435 is etched to be partly thinned, so that areas of the exposed top surfaces of the wiring layers 434 and 436 are increased. Then, a conductive film is formed, and the conductive film is selectively etched, so that the electrode layers 445$a$ and 445$b$ and the conductive layer 442 are formed.

After that, the insulating film 402 is formed over the electrode layers 445a and 445b, the conductive layer 442, and the stacked layer 403 including oxide semiconductor films.

Next, the insulating film 402 is selectively etched to have an opening reaching the conductive layer 442. Then, a conductive film is formed, and the conductive film is selectively etched to form the electrode layer 438 that is electrically connected to the conductive layer 442. The insulating film 407 functioning as a bather film is provided so as to cover the electrode layer 438.

Figure 3A:
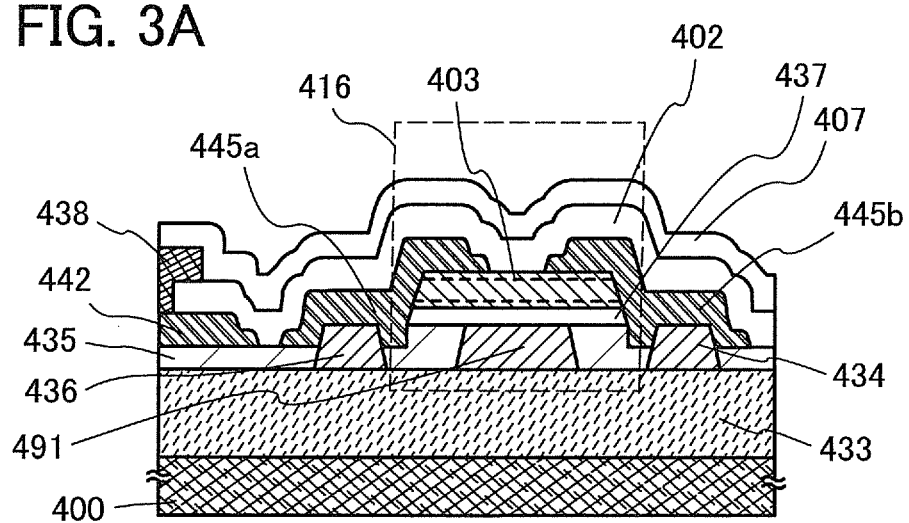
FIGS. 3A and 3B are cross-sectional views illustrating one embodiment of the present invention.

Through the above steps, a transistor 416 of this embodiment can be manufactured (see FIG. 3A). The transistor 416 is an example of a bottom-gate transistor. FIG. 3A is a cross-sectional view taken along the channel length direction of the transistor 416.

Figure 3B:
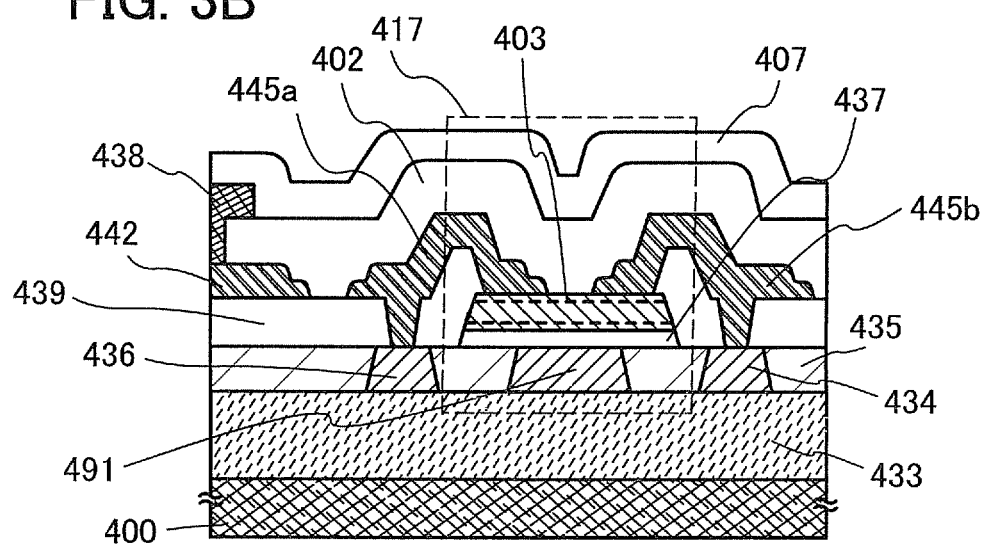

FIG. 3B illustrates another example of a bottom-gate transistor. In a transistor 417 illustrated in FIG. 3B, after the steps up to and including the step in FIG. 1C of Embodiment 1 are performed, an interlayer insulating film 439 is provided, and an opening reaching the wiring layer 434 and an opening reaching the wiring layer 436 are formed in the interlayer insulating film 439. Then, the electrode layers 445a and 445b are formed. The electrode layer 445a is electrically connected to the wiring layer 436, and the electrode layer 445b is electrically connected to the wiring layer 434.

Note that the interlayer insulating film 439 may be formed using the same material as that in the insulating film 402.

Each of the transistor 416 in FIG. 3A and the transistor 417 in FIG. 3B has a structure such that yield can be improved by securely connecting the electrode layers 445a and 445b to the wiring layers 434 and 436.

This embodiment can be freely combined with Embodiment 1.

Embodiment 3

In this embodiment, an example of a semiconductor device including the transistor described in Embodiment 1 will be described with reference to FIGS. 4A and 4B.

Figure 4A:
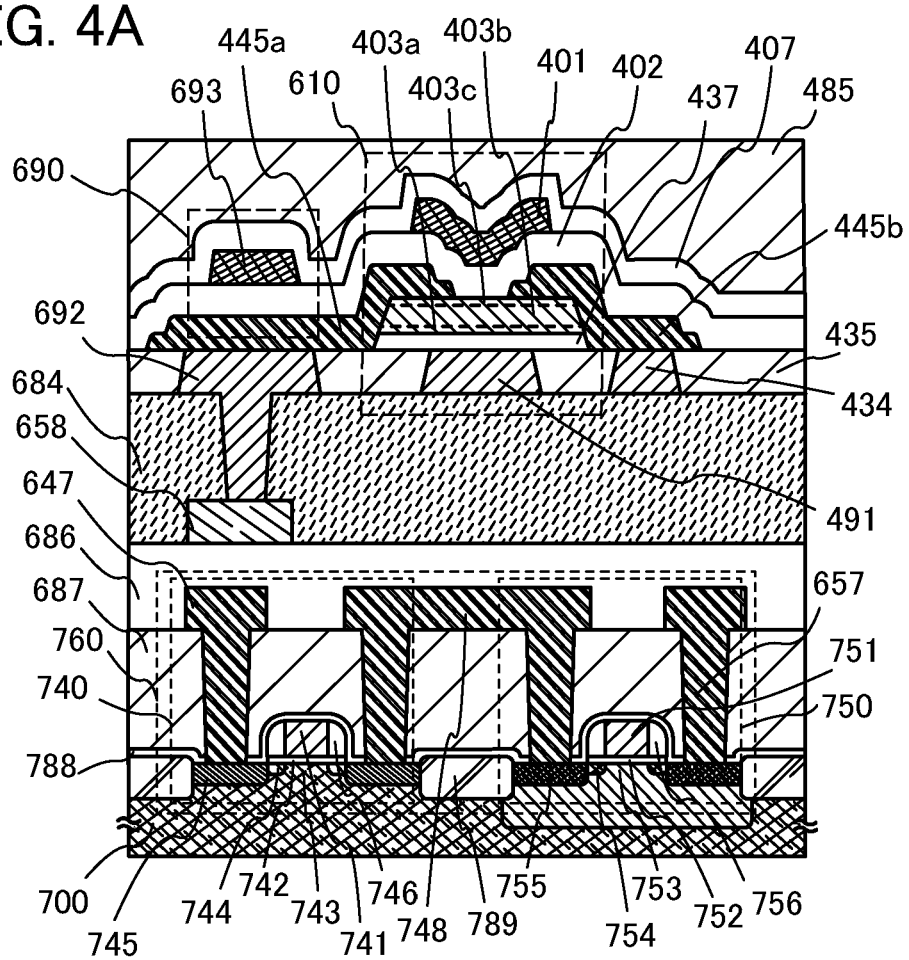
FIGS. 4A and 4B are a cross-sectional view and a circuit diagram illustrating one embodiment of a semiconductor device.
Figure 4B:
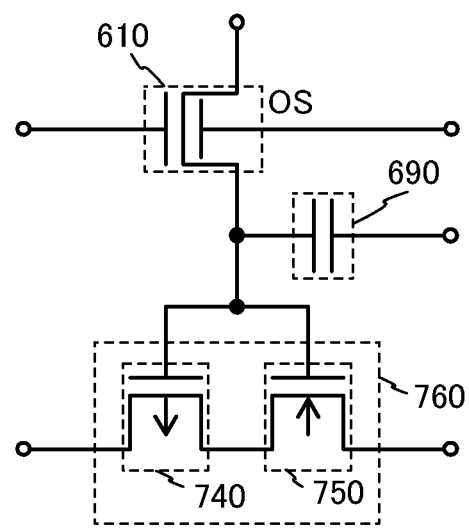

The semiconductor device illustrated in FIGS. 4A and 4B includes transistors 740 and 750 including a first semiconductor material in a lower portion, and a transistor 610 including a second semiconductor material in an upper portion. The transistor 610 has the same structure as the transistor 415 described in Embodiment 1. The same reference numerals are used for the same parts as those in FIGS. 2A to 2C. FIG. 4B is a circuit diagram of the semiconductor device in FIG. 4A.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can easily operate at high speed. On the other hand, a transistor including an oxide semiconductor enables charge to be held for a long time owing to its characteristics.

As a substrate used in the semiconductor device, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the semiconductor substrate. The semiconductor device in FIG. 4A is an example in which the channel formation region is formed in the semiconductor substrate to form a lower transistor.

In the semiconductor device in FIG. 4A, a single crystal silicon substrate is used as a substrate 700, and the transistors 740 and 750 are formed using the single crystal silicon substrate. As the first semiconductor material, single crystal silicon is used. The transistor 740 is an n-channel transistor and the transistor 750 is a p-channel transistor. The transistors 740 and 750 are electrically connected to each other to form a complementary metal oxide semiconductor (CMOS) circuit 760.

Note that in this embodiment, since the single crystal silicon substrate having p-type conductivity is used as the substrate 700, an impurity element imparting n-type conductivity is added to a formation region of the transistor 750 that is the p-channel transistor to form an n-well. A channel formation region 753 of the transistor 750 is formed in the n-well. As the impurity element imparting n-type conductivity, phosphorus (P), arsenic (As), or the like can be used.

Therefore, an impurity element imparting p-type conductivity is not added to a formation region of the transistor 740 that is the n-channel transistor; however, a p-well may be formed by adding an impurity element imparting p-type conductivity. As the impurity element imparting p-type conductivity, boron (B), aluminum (Al), gallium (Ga), or the like may be used.

On the other hand, in the case of using a single crystal silicon substrate having n-type conductivity, an impurity element imparting p-type conductivity may be added to form a p-well.

The transistor 740 includes a channel formation region 743, an n-type impurity region 744 functioning as a lightly doped drain (LDD) region or an extension region, an n-type impurity region 745 functioning as a source region or a drain region, a gate insulating film 742, and a gate electrode layer 741. The n-type impurity region 745 has a higher impurity concentration than the n-type impurity region 744. Sidewall insulating layers 746 are provided on side surfaces of the gate electrode layer 741. The n-type impurity regions 744 and the n-type impurity regions 745 having different impurity concentrations can be formed in a self-aligned manner by using the gate electrode layer 741 and the sidewall insulating layers 746 as masks.

The transistor 750 includes the channel formation region 753, a p-type impurity region 754 functioning as a lightly doped drain (LDD) region or an extension region, a p-type impurity region 755 functioning as a source region or a drain region, a gate insulating film 752, and a gate electrode layer 751. The p-type impurity region 755 has a higher impurity concentration than the p-type impurity region 754. Sidewall insulating layers 756 are provided on side surfaces of the gate electrode layer 751. The p-type impurity regions 754 and the p-type impurity regions 755 having different impurity concentrations can be formed in a self-aligned manner by using the gate electrode layer 751 and the sidewall insulating layers 756 as masks.

In the substrate 700, an element separation region 789 separates the transistor 740 and the transistor 750, and insulating films 788 and 687 are stacked over the transistor 740 and the transistor 750. A wiring layer 647 electrically connected to the n-type impurity region 745 through an opening in the insulating film 788 and the insulating film 687 and a wiring layer 657 electrically connected to the p-type impurity region 755 through an opening in the insulating film 788 and the insulating film 687 are provided over the insulating film 687. A wiring layer 748 is provided over the insulating film 687 so as to electrically connect the transistor 740 and the transistor 750. The wiring layer 748 is electrically connected to the n-type impurity region 745 through an opening that is formed in the insulating film 788 and the insulating film 687 and reaches the n-type impurity region 745. Further, the wiring layer 748 is electrically connected to the p-type impurity region 755 through an opening that is formed in the insulating film 788 and the insulating film 687 and reaches the p-type impurity region 755.

An insulating film 686 is provided over the insulating film 687, the wiring layer 647, the wiring layer 748, and the wiring layer 657. A wiring layer 658 is formed over the insulating film 686. The wiring layer 658 is electrically connected to a gate wiring through an opening in the insulating films 788, 687, and 686. The gate wiring is formed over the gate insulating film 742 and the gate insulating film 752. The gate wiring branches into the gate electrode layer 741 and the gate electrode layer 751.

The semiconductor device of this embodiment is not limited to the structure in FIG. 4A. As the transistors 740 and 750, a transistor containing silicide (salicide) or a transistor which does not include a sidewall insulating layer may be used. With a structure having a silicide (salicide), resistance of the source region and the drain region can be lowered and the speed of the semiconductor device can be increased. In addition, the semiconductor device can operate at low voltage, and thus the power consumption thereof can be reduced.

Next, the structures of upper elements provided over the lower transistor in the semiconductor device in FIGS. 4A and 4B are described.

An insulating film 684 is stacked over the insulating film 686 and the wiring layer 658. The conductive layer 491, the wiring layer 434 and a wiring layer 692 are formed over the insulating film 684.

The oxide insulating film 435 is provided so as to bury the conductive layer 491, the wiring layer 434 and the wiring layer 692. Over the oxide insulating film 435, the insulating film 437 is provided. Over the insulating film 437, the first oxide semiconductor film 403a, the second oxide semiconductor film 403b having different composition from that of the first oxide semiconductor film 403a, and the third oxide semiconductor film 403c having the almost same composition as the first oxide semiconductor film 403a are provided in this order. In addition, over the third oxide semiconductor film 403c, the electrode layers 445a and 445b each having projections at lower end portions are provided. The insulating film 402 is provided over and in contact with a region of the second oxide semiconductor film 403b which overlaps with neither the source electrode layer 445a nor the drain electrode layer 445b (the region is a channel formation region). The gate electrode layer 401 is provided over the insulating film 402.

A capacitor 690 is also formed over the oxide insulating film 435 by the same process as that of the transistor 610. The capacitor 690 includes the electrode layer 445a functioning as one of electrodes, a capacitor electrode layer 693 functioning as the other electrode, and the insulating film 402 which is provided between the electrodes and functions as a dielectric. The capacitor electrode layer 693 is formed in the same step as the gate electrode layer 401.

By setting the potential of the conductive layer 491 to GND (or a fixed potential), the conductive layer 491 serves as a back gate which controls the electrical characteristics of the transistor 610. The conductive layer 491 has a function of preventing static electricity. In the case where the threshold voltage of the transistor 610 is not required to be controlled by the conductive layer 491 in order to make the transistor 610 be a normally-off transistor, the conductive layer 491 is not necessarily provided. In the case where the transistor 610 is used for part of a particular circuit and a problem might be caused by providing the conductive layer 491, the conductive layer 491 is not necessarily provided in the circuit.

The wiring layer 692 is electrically connected to the wiring layer 658 through an opening in the insulating film 684. In the example in this embodiment, the insulating film 684 is subjected to planarization treatment using a CMP method.

In the semiconductor device, the insulating film 684 is provided between the lower portion and the upper portion, and functions as a bather film to prevent impurities such as hydrogen, which cause deterioration or a change in electrical characteristics of the transistor 610 in the upper portion, from entering the upper portion from the lower portion. Therefore, a dense inorganic insulating film having a high function of blocking impurities and the like (e.g., an aluminum oxide film or a silicon nitride film) is preferably used. The insulating film 684 can be formed using the same material as that of the insulating film 433 in Embodiment 1.

In the case of using the same manufacturing method as that described in Embodiment 1, the transistor 610 can be manufactured similarly to the transistor 415. In addition, after the insulating film 407 is formed, an interlayer insulating film 485 is formed. Further, a semiconductor device having a multilayer structure in which an embedded wiring is formed in the interlayer insulating film 485 and another semiconductor element, another wiring, or the like is formed above the embedded wiring may be manufactured.

In addition, this embodiment can be freely combined with Embodiment 1 or Embodiment 2.

Embodiment 4

Figure 5A:
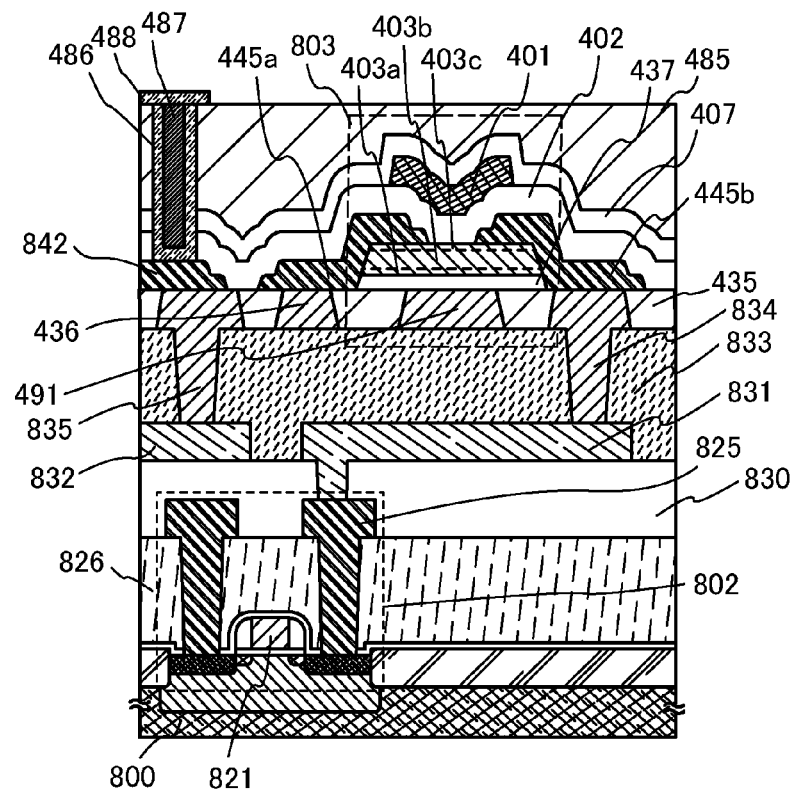
FIGS. 5A to 5C are a cross-sectional view and circuit diagrams illustrating one embodiment of a semiconductor device.
Figure 5B:
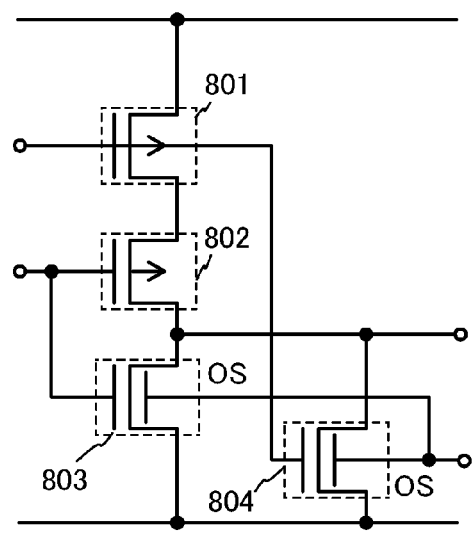
Figure 5C:
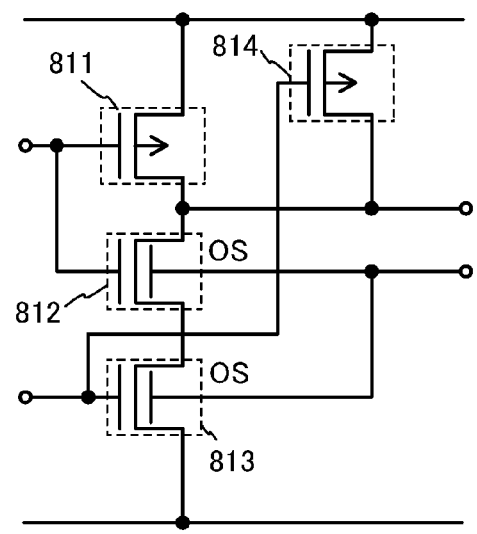

As another example of a semiconductor device including the transistor described in Embodiment 1, a cross-sectional view of a NOR circuit, which is a logic circuit, is illustrated in FIG. 5A. FIG. 5B is a circuit diagram of the NOR circuit in FIG. 5A, and FIG. 5C is a circuit diagram of a NAND circuit.

In the NOR circuit illustrated in FIGS. 5A and 5B, p-channel transistors 801 and 802 each have a structure similar to that of the transistor 750 in FIGS. 4A and 4B in that a single crystal silicon substrate is used for a channel formation region, and n-channel transistors 803 and 804 each have a structure similar to that of the transistor 610 in FIGS. 4A and 4B and that of the transistor 415 in Embodiment 1 in that an oxide semiconductor film is used for a channel formation region.

In the NOR circuit illustrated in FIGS. 5A and 5B, the transistors 803 and 804 each include the conductive layer 491 controlling electrical characteristics of the transistors to overlap with a gate electrode layer with an oxide semiconductor film provided therebetween. By controlling the potential of the conductive layer to GND, for example, the threshold voltages of the transistors 803 and 804 are further moved in the positive direction, so that the transistors can be normally-off. In the NOR circuit in this embodiment, conductive layers which are provided in the transistors 803 and 804 and can function as back gates are electrically connected to each other. However, one embodiment of the present invention is not limited to this structure, and the conductive layers functioning as back gates may be individually electrically controlled.

In the semiconductor device illustrated in FIG. 5A, a single crystal silicon substrate is used as a substrate 800, the transistor 802 is formed using the single crystal silicon substrate, and the transistor 803 in which stacked oxide semiconductor films are used for a channel formation region is formed over the transistor 802.

The gate electrode layer 401 of the transistor 803 is electrically connected to a wiring layer 832. The wiring layer 832 is electrically connected to a wiring layer 835. The gate electrode layer 401 of the transistor 803 is electrically connected to an embedded wiring, and the embedded wiring is electrically connected to an electrode layer 842. Note that the embedded wiring includes a first barrier metal film 486, a second barrier metal film 488, and a low-resistance conductive layer 487 covered by the first barrier metal film 486 and the second barrier metal film 488.

The embedded wiring is formed in the following manner. A contact hole reaching the electrode layer 842 is formed in the interlayer insulating film 485, the first barrier metal film 486 is formed, and a copper film or a copper alloy film is formed thereover so as to form the low-resistance conductive layer 487. Then, polishing is performed for planarization, and the second barrier metal film 488 is formed so as to protect the exposed low-resistance conductive layer 487. The embedded wiring includes the first barrier metal film 486, the second barrier metal film 488, and the low-resistance conductive layer 487 surrounded by the first barrier metal film 486 and the second barrier metal film 488.

Each of the first barrier metal film 486 and the second barrier metal film 488 may be formed using a conductive material which suppresses diffusion of copper contained in the low-resistance conductive layer 487. Examples of the conductive material are a tantalum nitride film, a molybdenum nitride film, and a tungsten nitride film.

The wiring layer 832 is provided in an opening formed in an insulating film 826 and an insulating film 830, the wiring layer 835 is provided in an opening formed in an insulating film 833, and the electrode layer 842 is formed over the wiring layer 835.

An electrode layer 825 of the transistor 802 is electrically connected to an electrode layer 445b of the transistor 803, through wiring layers 831 and 834. The wiring layer 831 is formed in an opening in the insulating film 830, the wiring layer 834 is formed in an opening in the insulating film 833. An electrode layer 445a and the electrode layer 445b function as source and drain electrode layers of the transistor 803.

The first oxide semiconductor film 403a is formed over and in contact with the insulating film 437, and the third oxide semiconductor film 403c is formed over and in contact with the second oxide semiconductor film 403b. With the insulating film 437 and the insulating film 402, unnecessary release of oxygen can be suppressed, and the second oxide semiconductor film 403b can be kept in an oxygen excess state. Thus, in the transistor 803, oxygen vacancies in the second oxide semiconductor film 403b and at the interface thereof can be supplied with oxygen efficiently. The transistor 804 has a structure and an effect which are similar to those of the transistor 803.

In the NAND circuit in FIG. 5C, p-channel transistors 811 and 814 each have a structure similar to that of the transistor 750 in FIGS. 4A and 4B, and n-channel transistors 812 and 813 each have a structure similar to that of the transistor 610 in FIGS. 4A and 4B in that an oxide semiconductor film is used for a channel formation region.

In the NAND circuit illustrated in FIG. 5C, the transistors 812 and 813 each includes a conductive layer controlling electrical characteristics of the transistors to overlap with a gate electrode layer with an oxide semiconductor film provided therebetween. By controlling the potential of the conductive layer to GND, for example, the threshold voltages of the transistors 812 and 813 are further moved in the positive direction, so that the transistors can be normally-off. In the NAND circuit in this embodiment, conductive layers which are provided in the transistors 812 and 813 and function as back gates are electrically connected to each other. However, one embodiment of the present invention is not limited to this structure, and the conductive layers functioning as back gates may be individually electrically controlled.

In the semiconductor device in this embodiment, the transistor in which an oxide semiconductor is used for the channel formation region and which has extremely low off-state current is employed; therefore, power consumption can be sufficiently reduced.

Further, with a stack of semiconductor elements using different semiconductor materials, a miniaturized and highly integrated semiconductor device with stable electric characteristics and a method for manufacturing the semiconductor device can be provided.

The NOR circuit and the NAND circuit including the transistors described in Embodiment 1 are described as examples in this embodiment; however, the present invention is not limited to the circuits, and an AND circuit, an OR circuit, or the like can be formed using the transistors described in Embodiment 1 or 2. For example, a semiconductor device (storage device) in which stored data can be held even when power is not supplied and which has an unlimited number of times of writing with the transistors described in Embodiment 1 or 2 can be manufactured.

Figure 6:
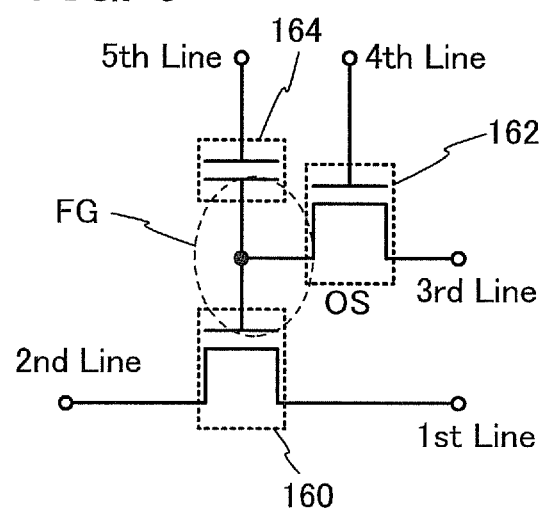
FIG. 6 is a circuit diagram illustrating one embodiment of a semiconductor device.

FIG. 6 is an example of a circuit diagram of a semiconductor device.

In FIG. 6, a first wiring (1st line) is electrically connected to a source electrode layer of a transistor 160. A second wiring (2nd line) is electrically connected to a drain electrode layer of the transistor 160. Any of the transistors 740, 750, and 802 described in this embodiment can be used as the transistor 160.

A third wiring (3rd line) is electrically connected to one of a source electrode layer and a drain electrode layer of a transistor 162, and a fourth line (4th line) is electrically connected to a gate electrode layer of the transistor 162. A gate electrode layer of the transistor 160 and the other of the source electrode layer and the drain electrode layer of the transistor 162 are electrically connected to one electrode of a capacitor 164. A fifth wiring (5th line) and the other electrode of the capacitor 164 are electrically connected to each other.

Any one of the transistors 415, 416, and 417 described in Embodiment 1 or 2 can be used as the transistor 162.

A semiconductor device having the circuit configuration in FIG. 6 utilizes a characteristic in which the potential of the gate electrode layer of the transistor 160 can be held, and thus enables data writing, holding, and reading as follows.

Writing and holding of data will be described. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as Low level charge and High level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the amount of off-state current of the transistor 162 is extremely small, the charge of the gate electrode layer of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level potential is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth wiring is set to a potential $V_0$ that is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the memory cell where data is not read, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth line.

FIG. 7 illustrates an example of one embodiment of a structure of a memory device.

FIG. 7 is a perspective view of a memory device. The memory device illustrated in FIG. 7 includes a plurality of layers of memory cell arrays (memory cell arrays 3400_1 to 3400_n (n is an integer greater than or equal to 2)) each including a plurality of memory cells as memory circuits in the upper portion, and a logic circuit 3004 in the lower portion which is necessary for operating the memory cell arrays 3400_1 to 3400_n.

FIG. 7 illustrates the logic circuit 3004, the memory cell array 3400_1, and the memory cell array 34002, and illustrates a memory cell 3170a and a memory cell 3170b as typical examples in the plurality of memory cells included in the memory cell array 3400_1 and the memory cell array 3400_2. The memory cell 3170a and the memory cell 3170b can have a configuration similar to the circuit configuration described in this embodiment with reference to FIG. 6, for example.

Note that as transistors included in the memory cells 3170a and 3170b, a transistor in which a channel formation region is formed in an oxide semiconductor film is used. The structure of the transistor in which the channel formation region is formed in the oxide semiconductor film is the same as the structure described in Embodiment 1, and thus the description of the structure is omitted.

The logic circuit 3004 includes a transistor in which a semiconductor material other than an oxide semiconductor is used for a channel formation region. For example, a transistor obtained by providing an element isolation insulating layer on a substrate containing a semiconductor material (e.g., silicon) and forming a region serving as the channel formation region in a region surrounded by the element isolation insulating layer can be used. Note that the transistor may be a transistor obtained in such a manner that the channel formation region is formed in a semiconductor film such as a poly-crystalline silicon film formed on an insulating surface or in a silicon film of an SOI substrate.

The memory cell arrays 3400_1 to 3400_n and the logic circuit 3004 are stacked with interlayer insulating layers provided therebetween, and are electrically connected to each other as appropriate through electrodes and wirings which penetrate the interlayer insulating layers, for example.

When a transistor having a channel formation region formed using an oxide semiconductor and having extremely low off-state current is employed in the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having high electric characteristics and a method for manufacturing the semiconductor device can be provided.

This embodiment can be freely combined with any of Embodiment 1, Embodiment 2, and Embodiment 3.

Embodiment 5

In this embodiment, a central processing unit (CPU) at least part of which includes any of the transistors 415, 416, and 417 described in Embodiment 1 or 2 is described as an example of a semiconductor device.

Figure 8A:
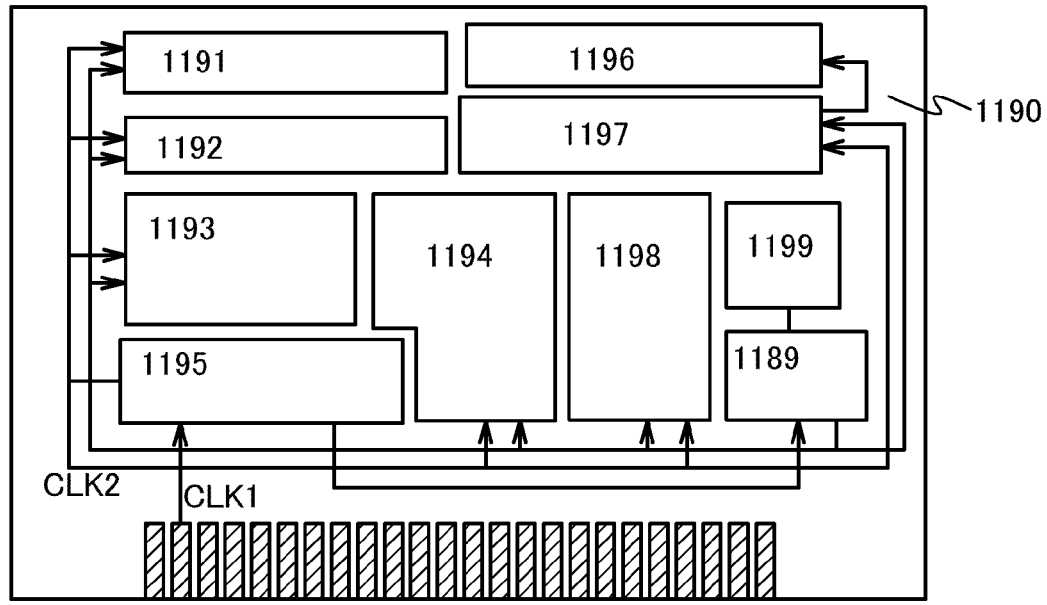
FIGS. 8A to 8C are a block diagram and circuit diagrams illustrating one embodiment of a semiconductor device.

FIG. 8A is a block diagram illustrating a specific structure of the CPU. The CPU illustrated in FIG. 8A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 8A is just an example in which a configuration is simplified, and actual CPUs may have a variety of configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 8A, a memory cell is provided in the register 1196. As the memory cell of the register 1196, the memory cell described in Embodiment 4 can be used.

In the CPU illustrated in FIG. 8A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 8B:
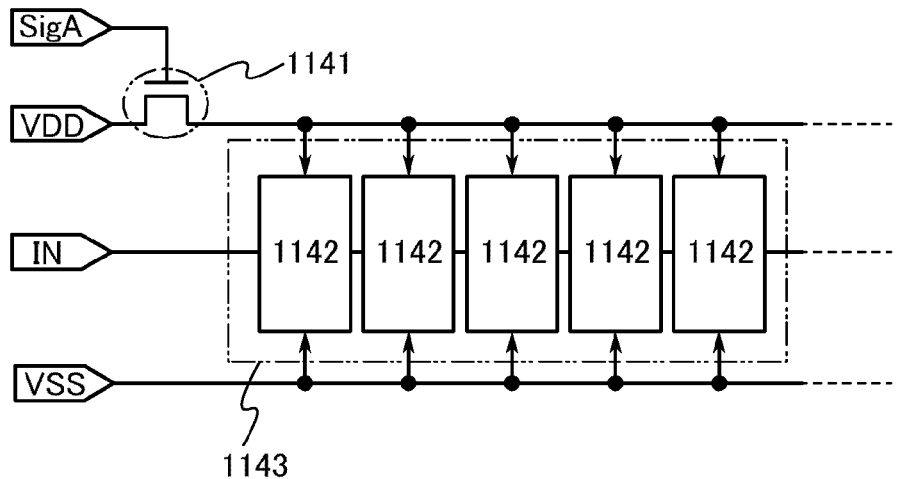
Figure 8C:
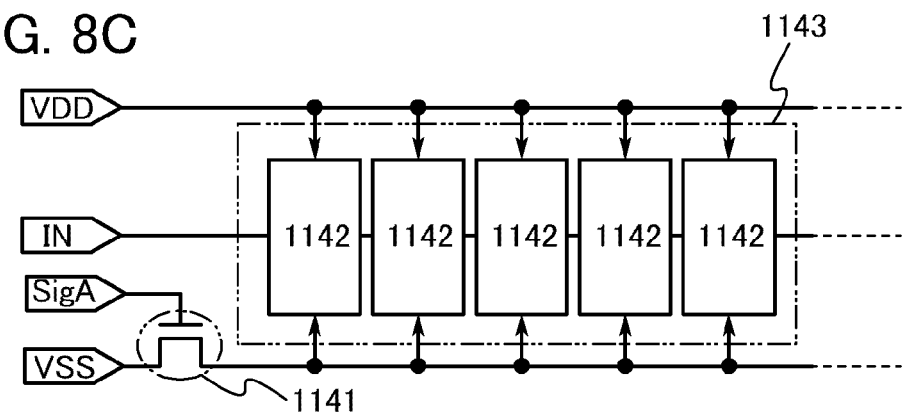

The supply of power can be stopped with a switching element provided between a memory cell group and a node to which a power supply potential VDD or a power supply potential VSS is supplied, as illustrated in FIG. 8B or FIG. 8C. Circuits illustrated in FIGS. 8B and 8C are described below.

FIGS. 8B and 8C each illustrate an example of a memory circuit configuration in which any one of transistors 415, 416, and 417 in Embodiment 1 or 2 is used as a switching element which controls a supply of a power supply potential to a memory cell.

The memory device illustrated in FIG. 8B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 8B, any one of the transistors 415, 416, and 417 described in Embodiment 1 or 2 is used as the switching element 1141, and the switching of the transistor is controlled by a signal Sig A supplied to a gate electrode layer thereof.

Note that FIG. 8B illustrates the structure in which the switching element 1141 includes only one transistor; however, the structure is not limited thereto, and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 8B, the switching element 1141 may control the supply of the low-level power supply potential VSS.

In FIG. 8C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Embodiment 6

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of such electronic devices are illustrated in FIGS. 9A to 9C and FIGS. 10A to 10C.

Figure 9A:
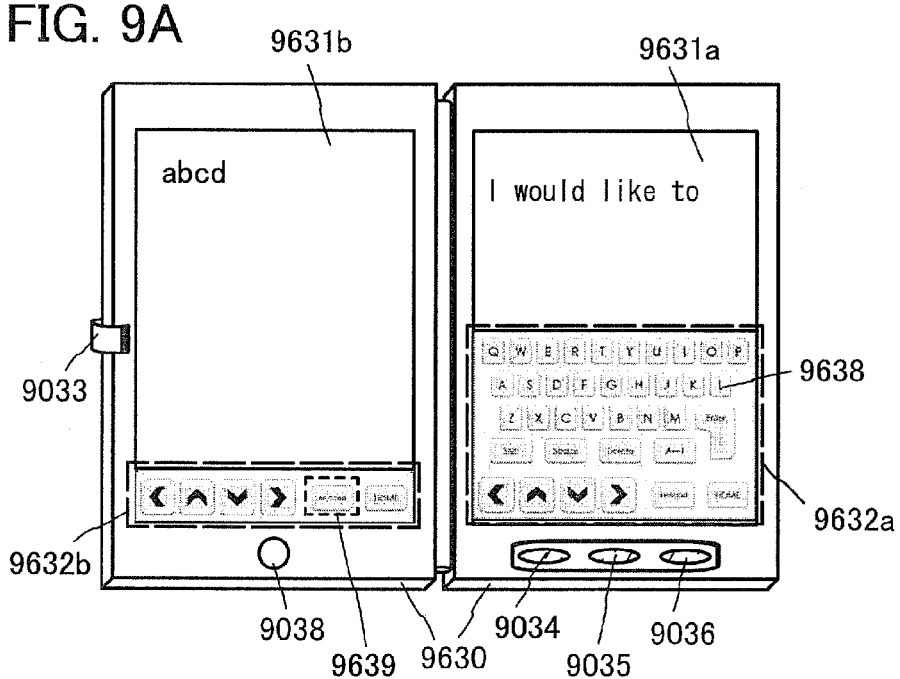
FIGS. 9A to 9C illustrate an electronic device.
Figure 9B:
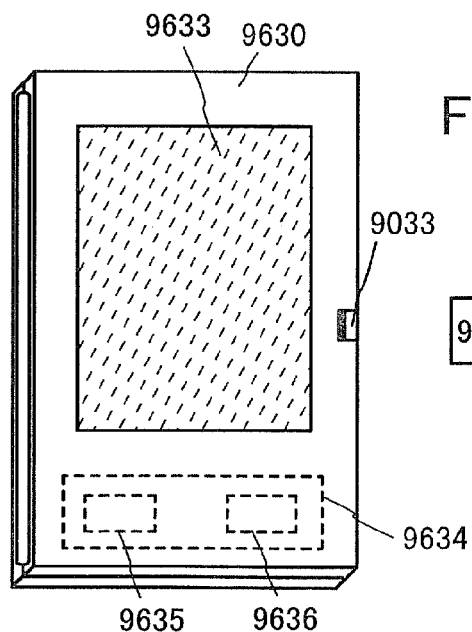

FIGS. 9A and 9B illustrate a tablet terminal that can be folded. In FIG. 9A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

In such a portable device illustrated in FIGS. 9A and 9B, an SRAM or a DRAM is used as a memory element for temporarily storing image data. For example, the semiconductor device described in Embodiment 4 can be used as a memory. By employing the semiconductor device described in the above embodiment for the memory, data can be written and read at high speed and held for a long time, and power consumption can be sufficiently reduced. A CPU for performing image processing or arithmetic processing is used in the portable device illustrated in FIGS. 9A and 9B. As the CPU, the CPU described in Embodiment 5 can be used, in which case the CPU described in Embodiment 5 is used, power consumption of the portable device can be reduced.

A touch panel region 9632*a* can be provided in a part of the display portion 9631*a*, in which data can be input by touching displayed operation keys 9638. Although half of the display portion 9631*a* has only a display function and the other half has a touch panel function, one embodiment of the present invention is not limited to the structure. However, the structure of the display portion 9631*a* is not limited to this, and all the area of the display portion 9631*a* may have a touch panel function. For example, all the area of the display portion 9631*a* can display keyboard buttons and serve as a touch panel while the display portion 9631*b* can be used as a display screen.

Like the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631*b*.

Touch input can be performed concurrently on the touch panel regions 9632*a* and 9632*b*.

The display-mode switching button 9034 allows switching between a landscape mode and a portrait mode, color display and black-and-white display, and the like. With the switching button 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631*a* and the display portion 9631*b* have the same display size in FIG. 9A, an embodiment of the present invention is not limited to this example. The display portion 9631*a* and the display portion 9631*b* may have different sizes or different display quality. For example, one of them may be a display panel that can display higher-definition images than the other.

FIG. 9B illustrates the tablet terminal folded, which includes the housing 9630, a solar cell 9633, a charge and discharge control circuit 9634, a battery 9635, and a DCDC converter 9636. Note that FIG. 9B illustrates an example in which the charge and discharge control circuit 9634 includes the battery 9635 and the DCDC converter 9636.

Since the tablet can be folded in two, the housing 9630 can be closed when the tablet is not in use. Thus, the display portions 9631*a* and 9631*b* can be protected, and thereby providing a tablet with high endurance and high reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633, which is attached on the surface of the tablet terminal, supplies electric power to a touch panel, a display portion, an image signal processor, and the like. Note that the solar cell 9633 can be provided on one or both surfaces of the housing 9630, so that the battery 9635 can be charged efficiently. When a lithium ion battery is used as the battery 9635, there is an advantage of downsizing or the like.

Figure 9C:
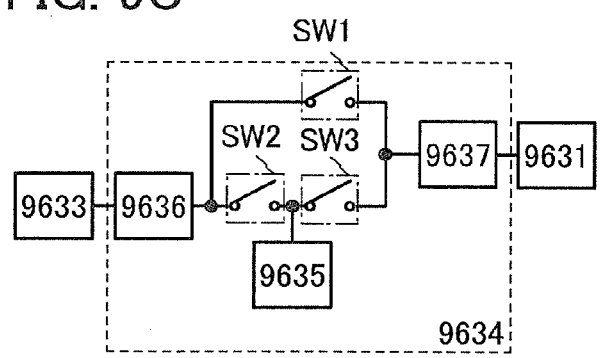

The structure and operation of the charge and discharge control circuit 9634 illustrated in FIG. 9B are described with reference to a block diagram of FIG. 9C. FIG. 9C illustrates the solar cell 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 9B.

First, an example of operation in the case where power is generated by the solar cell 9633 using external light is described. The voltage of power generated by the solar cell 9633 is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 10A:
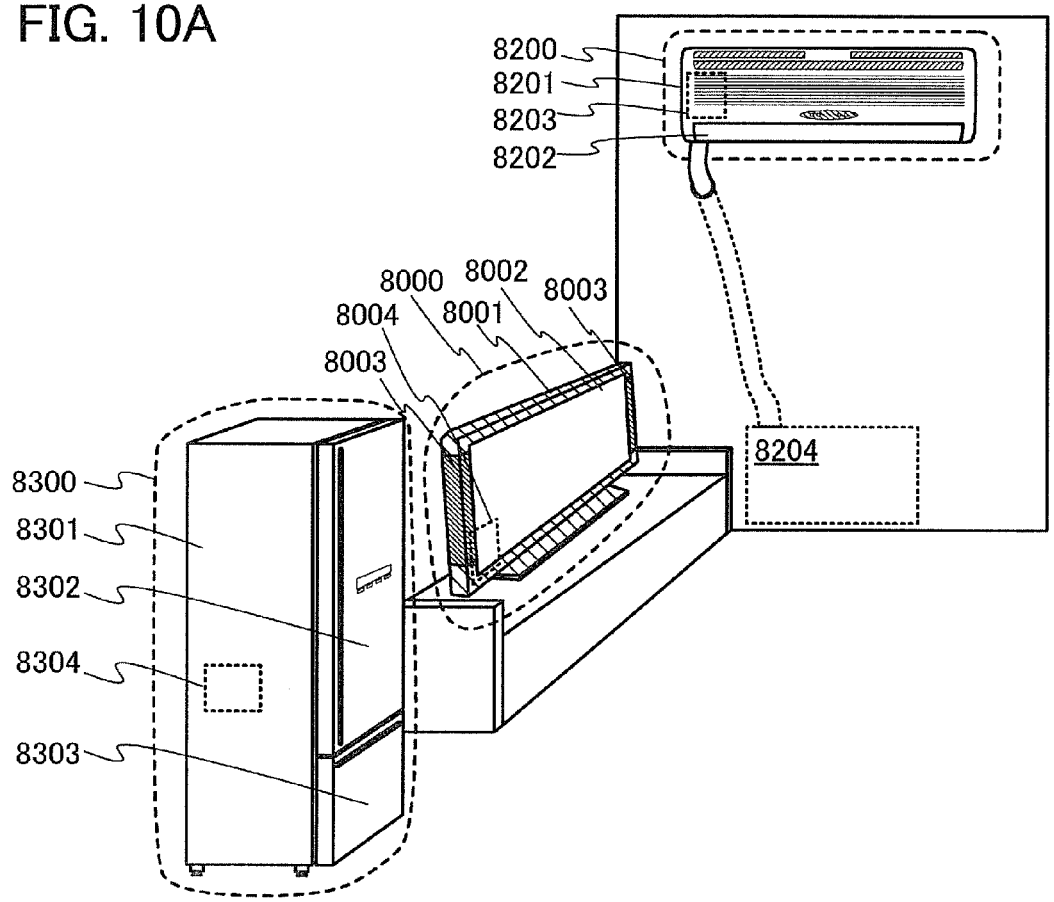
FIGS. 10A to 10C illustrate an electronic device.

In a television set 8000 in FIG. 10A, a display portion 8002 is incorporated in a housing 8001. The display portion 8002 displays an image and a speaker portion 8003 can output sound.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory described in Embodiment 4 or the CPU described in Embodiment 5 can be used in the television set 8000.

In FIG. 10A, an air conditioner which includes an indoor unit 8200 and an outdoor unit 8204 is an example of an electronic device in which the CPU of Embodiment 5 is used. Specifically, the indoor unit 8200 includes a housing 8201, an air outlet 8202, a CPU 8203, and the like. Although the CPU 8203 is provided in the indoor unit 8200 in FIG. 10A, the CPU 8203 may be provided in the outdoor unit 8204. Alternatively, the CPU 8203 may be provided in both the indoor unit 8200 and the outdoor unit 8204. By using the CPU described in Embodiment 5 as the CPU in the air conditioner, power consumption can be reduced.

In FIG. 10A, an electric refrigerator-freezer 8300 is an example of an electronic device which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 10A, the CPU 8304 is provided in the housing 8301. When the CPU described in Embodiment 5 is used as the CPU 8304 of the electric refrigerator-freezer 8300, power consumption of the electric refrigerator-freezer 8300 can be reduced.

Figure 10B:
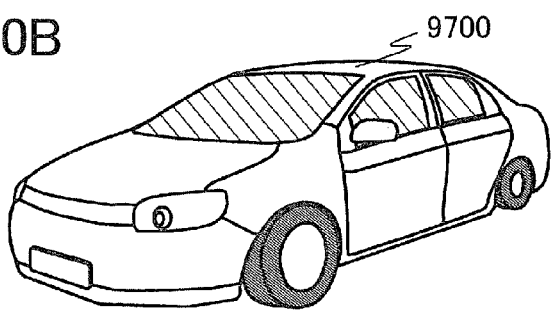
Figure 10C:
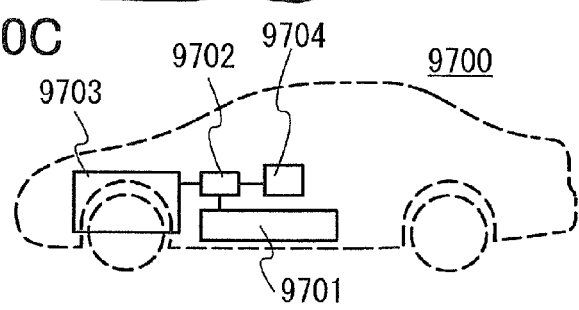

FIG. 10B illustrates an example of an electric vehicle which is an example of an electronic device. An electric vehicle 9700 is equipped with a secondary battery 9701 (FIG. 10C). The output of the electric power of the secondary battery 9701 is adjusted by a control circuit 9702 so that the electric power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combination with any of the other embodiments.

EXPLANATION OF REFERENCE

160: transistor, 162: transistor, 164: capacitor, 400: substrate, 401: gate electrode layer, 402: insulating film, 403: stacked layer including oxide semiconductor films, 403a: first oxide semiconductor film, 403b: second oxide semiconductor film, 403c: third oxide semiconductor film, 415: transistor, 416: transistor, 417: transistor, 433: insulating film, 434: wiring layer, 435: oxide insulating film, 436: wiring layer, 437: insulating film, 438: electrode layer, 439: interlayer insulating film, 442: conductive layer, 445a: electrode layer, 445b: electrode layer, 485: interlayer insulating film, 486: barrier metal film, 487: low-resistance conductive layer, 488: barrier metal film, 491: conductive layer, 610: transistor, 647: wiring layer, 657: wiring layer, 658: wiring layer, 684: insulating film, 686: insulating film, 687: insulating film, 690: capacitor, 692: wiring layer, 693: capacitor electrode layer, 700: substrate, 740: transistor, 741: gate electrode layer, 742: gate insulating film, 743: channel formation region, 744: n-type impurity region, 745: n-type impurity region, 746: sidewall insulating layer, 748: wiring layer, 750: transistor, 751: gate electrode layer, 752: gate insulating film, 753: channel formation region, 754: p-type impurity region, 755: p-type impurity region, 756: sidewall insulating layer, 760: circuit, 788: insulating film, 789: element separation region, 800: substrate, 801: transistor, 802: transistor, 803: transistor, 804: transistor, 811: transistor, 812: transistor, 813: transistor, 814: transistor, 825: electrode layer, 826: insulating film, 830: insulating film, 831: wiring layer, 832: wiring layer, 833: insulating film, 834: wiring layer, 835: wiring layer, 842: electrode layer, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3004: logic circuit, 3170a: memory cell, 3170b: memory cell, 3400: memory cell array, 8000: television set, 8001: housing, 8002: display portion, 8003: speaker portion, 8200: indoor unit, 8201: housing, 8202: air outlet, 8203: CPU, 8204: outdoor unit, 8300: electric refrigerator-freezer, 8301: housing, 8302: door for refrigerator, 8303: door for freezer, 8304: CPU, 9033: clip, 9034: switching button, 9035: power button, 9036: switching button, 9038: operation button, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, 9638: operation key, 9639: button, 9700: electric vehicle, 9701: secondary battery, 9702: control circuit, 9703: driving device, 9704: processing unit This application is based on Japanese Patent Application serial no. 2012-125394 filed with Japan Patent Office on May 31, 2012, the entire contents of which are hereby incorporated by reference.

The invention claimed is:

1. A semiconductor device comprising:
   a gate electrode;
   a gate insulating layer over the gate electrode;
   a first oxide semiconductor layer over the gate insulating layer;
   a second oxide semiconductor layer over the first oxide semiconductor layer; and
   a third oxide semiconductor layer over the second oxide semiconductor layer,
   wherein each of the first oxide semiconductor layer, the second oxide semiconductor layer, and the third oxide semiconductor layer comprises at least indium and a metal element,
   wherein a composition of indium with respect to the metal element in the first oxide semiconductor layer is different from a composition of indium with respect to the metal element in the second oxide semiconductor layer, and
   wherein a side surface of the gate insulating layer and a side surface of the first oxide semiconductor layer are substantially aligned with each other.

2. The semiconductor device according to claim 1, wherein the metal element is gallium.

3. The semiconductor device according to claim 2,
wherein a composition of indium with respect to gallium in the second oxide semiconductor layer is higher than a composition of indium with respect to gallium in the first oxide semiconductor layer.

4. The semiconductor device according to claim 1, further comprising
a second gate electrode over the third oxide semiconductor layer.

5. The semiconductor device according to claim 1, further comprising an insulating layer over and in contact with the third oxide semiconductor layer,
wherein the insulating layer comprises silicon.

6. A semiconductor device comprising:
a gate electrode;
a gate insulating layer over the gate electrode;
a first oxide semiconductor layer over the gate insulating layer;
a second oxide semiconductor layer over the first oxide semiconductor layer; and
a third oxide semiconductor layer over the second oxide semiconductor layer,
wherein each of the first oxide semiconductor layer, the second oxide semiconductor layer, and the third oxide semiconductor layer comprises at least indium and a metal element,
wherein a composition of indium with respect to the metal element in the first oxide semiconductor layer is different from a composition of indium with respect to the metal element in the second oxide semiconductor layer,
wherein a composition of indium with respect to the metal element in the third oxide semiconductor layer is different from a composition of indium with respect to the metal element in the second oxide semiconductor layer, and
wherein a side surface of the gate insulating layer and a side surface of the first oxide semiconductor layer are substantially aligned with each other.

7. The semiconductor device according to claim 6, wherein the metal element is gallium.

8. The semiconductor device according to claim 7,
wherein a composition of indium with respect to gallium in the second oxide semiconductor layer is higher than a composition of indium with respect to gallium in the first oxide semiconductor layer.

9. The semiconductor device according to claim 7,
wherein a composition of indium with respect to gallium in the second oxide semiconductor layer is higher than a composition of indium with respect to gallium in the first oxide semiconductor layer, and
wherein a composition of indium with respect to gallium in the second oxide semiconductor layer is higher than a composition of indium with respect to gallium in the third oxide semiconductor layer.

10. The semiconductor device according to claim 6, further comprising
a second gate electrode over the third oxide semiconductor layer.

11. The semiconductor device according to claim 6, further comprising an insulating layer over and in contact with the third oxide semiconductor layer,
wherein the insulating layer comprises silicon.

12. A semiconductor device comprising:
a gate electrode;
a gate insulating layer over the gate electrode;
a first oxide semiconductor layer over the gate insulating layer;
a second oxide semiconductor layer over the first oxide semiconductor layer; and
a third oxide semiconductor layer over the second oxide semiconductor layer,
wherein each of the first oxide semiconductor layer, the second oxide semiconductor layer, and the third oxide semiconductor layer comprises at least indium and a metal element,
wherein a composition of indium with respect to the metal element in the first oxide semiconductor layer is different from a composition of indium with respect to the metal element in the second oxide semiconductor layer,
wherein a composition of indium with respect to the metal element in the third oxide semiconductor layer is different from a composition of indium with respect to the metal element in the second oxide semiconductor layer,
wherein a thickness of the second oxide semiconductor layer is larger than a thickness of the first oxide semiconductor layer and a thickness of the third oxide semiconductor layer, and
wherein a side surface of the gate insulating layer and a side surface of the first oxide semiconductor layer are substantially aligned with each other.

13. The semiconductor device according to claim 12, wherein the metal element is gallium.

14. The semiconductor device according to claim 13,
wherein a composition of indium with respect to gallium in the second oxide semiconductor layer is higher than a composition of indium with respect to gallium in the first oxide semiconductor layer.

15. The semiconductor device according to claim 13,
wherein a composition of indium with respect to gallium in the second oxide semiconductor layer is higher than a composition of indium with respect to gallium in the first oxide semiconductor layer, and
wherein a composition of indium with respect to gallium in the second oxide semiconductor layer is higher than a composition of indium with respect to gallium in the third oxide semiconductor layer.

16. The semiconductor device according to claim 12, further comprising
a second gate electrode over the third oxide semiconductor layer.

17. The semiconductor device according to claim 12, further comprising an insulating layer over and in contact with the third oxide semiconductor layer,
wherein the insulating layer comprises silicon.

* * * * *